United States Patent
Peschke

(10) Patent No.: US 9,667,233 B2
(45) Date of Patent: May 30, 2017

(54) COMPENSATION CIRCUIT FOR OFFSET VOLTAGE IN A MEASUREMENT AMPLIFIER AND/OR FOR DC-SIGNAL COMPONENT IN A MEASUREMENT SIGNAL

(71) Applicant: Rohde & Schwarz GmbH & Co. KG, Munich (DE)

(72) Inventor: Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/059,295

(22) Filed: Mar. 2, 2016

(65) Prior Publication Data

US 2016/0261254 A1    Sep. 8, 2016

(30) Foreign Application Priority Data

Mar. 2, 2015    (DE) .................. 10 2015 203 651

(51) Int. Cl.
*H03L 5/00* (2006.01)
*H03K 5/003* (2006.01)

(52) U.S. Cl.
CPC .................. *H03K 5/003* (2013.01)

(58) Field of Classification Search
CPC   H03K 5/02; H03K 5/24; H03K 5/007; H03K 5/08; H03K 5/1252; H03K 5/086; H03K 5/088; H03M 2201/64; H03M 3/344; H03M 3/364; H03G 1/00; H03G 11/00; H03G 2201/10; H03G 2201/30

USPC .................. 327/306–307, 309–312, 323
See application file for complete search history.

(56) References Cited

U.S. PATENT DOCUMENTS

| 5,384,532 A | 1/1995 | Uhling |
| 7,382,166 B1 * | 6/2008 | Ide .......................... H03F 1/34 327/306 |
| 2010/0176795 A1 | 7/2010 | Peschke et al. |

FOREIGN PATENT DOCUMENTS

| CN | 102735887 A | 10/2012 |
| DE | 102006052720 A1 | 2/2008 |
| DE | 102010027567 A1 | 8/2011 |
| EP | 1688748 A1 | 8/2006 |

* cited by examiner

*Primary Examiner* — Lincoln Donovan
*Assistant Examiner* — Diana J Cheng
(74) *Attorney, Agent, or Firm* — Potomac Technology Law, LLC

(57) ABSTRACT

A circuit for the compensation of an offset voltage in a measurement amplifier and/or of a DC-signal component contained in a measurement signal is provided. The circuit comprises a measurement-signal terminal for the measurement signal. The non-inverting input of the measurement amplifier serves for the feeding in of an AC-signal component of the measurement signal via a first capacitor. Additionally, the circuit contains a second amplifier for the addition of the DC-signal component in the measurement signal and of a signal corresponding to the negative offset voltage and to the negative DC-signal component, and a unit arranged at the input end or output end of the measurement amplifier for subtraction of an output signal of the second amplifier from the AC-signal component of the measurement signal.

18 Claims, 2 Drawing Sheets

COMPENSATION CIRCUIT FOR OFFSET VOLTAGE IN A MEASUREMENT AMPLIFIER AND/OR FOR DC-SIGNAL COMPONENT IN A MEASUREMENT SIGNAL

CROSS REFERENCE TO RELATED APPLICATIONS

This application claims priority of Germany patent application DE102015203651.0, filed on Mar. 2, 2015, the entirety of which is incorporated by reference herein.

FIELD

The invention relates to a compensation circuit for an offset voltage in a measurement amplifier and/or for a DC-signal component in a measurement signal.

BACKGROUND

In a measuring device (e.g., an oscilloscope), measurement signals are supplied via different coupling paths to a measurement amplifier. As illustrated by way of example in FIG. 1, the substantial coupling paths are the direct-current (DC) voltage coupling, which takes place via a direct signal line 1 with the non-inverting input 2 of the measurement amplifier 3; the alternating-current (AC) voltage coupling, which takes place via a signal line 5 provided with a capacitor 4 for the blocking of DC-signal components, with the non-inverting input 2 of the measurement amplifier 3; and the ground coupling, in which the non-inverting input 2 of the measurement amplifier 3 is connected to a ground 6. The selection by which the individual coupling paths are connected to the non-inverting input 2 of the measurement amplifier 3 takes place via switches $7_1$, $7_2$ and $7_3$.

Further, the non-inverting input 2 of the measurement amplifier 3 can be additionally connected to the first terminal 8 of a resistor 9, of which the second terminal 10 is connected to the ground 6. With the selected impedance value of this resistor 9, the input impedance of the circuit can be adjusted in a targeted manner (e.g., to a system impedance of 50 ohms).

For the compensation of an internal offset voltage in the measurement amplifier 3, and of a DC-signal component in the measurement signal, the inverting input 11 of the measurement amplifier 3 can be connected, as in the case of the publication EP1688748A1, to the first terminal 12 of a voltage source 13 adjustable with regard to its voltage level, the second terminal 14 of which is connected to the ground 6.

Through the compensation, a displacement of the measurement signal to the zero point of the dynamic range of the measurement amplifier 3, and accordingly to the optimal operating point of the measurement amplifier 3, in which the measurement amplifier 3 comprises its maximum linearity, takes place.

This offset compensation, however, presents a disadvantage in that the voltage level of the voltage source is restricted to the maximum possible voltage level specified by the common-mode range of the measurement amplifier 3. Added to this, the linearity range of the measurement amplifier 3 is reduced by comparison with its common-mode range, so that a measurement amplifier 3 not operated at the optimal operating point (e.g., a measurement amplifier 3 that is operated with a common-mode voltage not equal to zero) causes a distortion of the measurement signal.

What is needed, therefore, is an approach for the compensation of the offset voltage present in a measurement amplifier, and of the DC-signal component present in a measurement signal, which can also compensate relatively high offset voltages in the measurement amplifier and relatively high DC-signal components in the measurement signal accurately.

SOME EXAMPLE EMBODIMENTS

Embodiments of the present invention advantageously address the foregoing requirements and needs, as well as others, by providing a compensation circuit and a measurement device and a measuring sensor for the compensation of the offset voltage present in the measurement amplifier, and of the DC-signal component present in a measurement signal, which can also compensate relatively high offset voltages in the measurement amplifier and relatively high DC-signal components in the measurement signal accurately.

In accordance with example embodiments, a separation of the measurement signal into its DC-signal component and its AC-signal component takes place in the compensation circuit. For this purpose, the AC-signal component of the measurement signal is guided via a first capacitor to the first input, the non-inverting input, of the measurement amplifier. The DC-signal component of the measurement signal is added in the second amplifier to a voltage which corresponds to the negative offset voltage of the measurement amplifier and/or to the negative DC-signal component of the measurement signal. Finally, a unit for subtraction of a signal at the output of the second amplifier from the AC-signal component of the measurement signal is connected downstream of the second amplifier.

Accordingly, the compensation of the DC-signal component of the measurement signal already takes place in the second amplifier. In the unit for subtraction, only the compensation of the offset voltage of the measurement amplifier must be implemented. If the compensation of the offset voltage is realized at the output end of the measurement amplifier, the operating point of the measurement amplifier is not displaced by the compensation signal at all. If the compensation of the offset voltage is implemented at the input end of the measurement amplifier, the operating point of the measurement amplifier is only displaced by a compensation value for the compensation of the offset voltage, and thus advantageously experiences a significantly smaller displacement by comparison with the prior art.

By way of example, the AC-signal component of the measurement signal is obtained from the signal components of the measurement signal above a threshold frequency which is obtained, in turn, from the capacitance of the first capacitor and the input impedance of the measurement amplifier of a resulting high-pass. By way of further example, the DC voltage component of the measurement signal is obtained from the bandwidth of the second amplifier comprising a low-pass behavior.

According to a further embodiment, if only the DC-signal component of the measurement signal is to be compensated, the DC-signal component, and a signal corresponding to the DC-signal component, is supplied to the second amplifier, which is configured as an adding amplifier. Through appropriate dimensioning of the resistors of the second amplifier, a voltage of at least approximately 0 Volt is obtained at the output of the second amplifier.

According to a further embodiment, the unit for subtraction is realized at the input end of the measurement amplifier, in that it is integrated at the input of the measurement amplifier in such a manner that the output of the second amplifier is connected to the inverting input of the measurement amplifier. The measurement amplifier may thus advantageously be operated at its optimal operating point, that is, with a common-mode input voltage of 0 Volt.

According to a further embodiment, if the unit for subtraction is realized at the output end of the measurement amplifier as a first subtraction element, of which the inputs are each connected to the output of the measurement amplifier or respectively to the output of the second amplifier, and at the same time, the inverting input of the measurement amplifier is connected to ground, then, in this case also, the measurement amplifier may advantageously be operated at its optimal operating point, that is, with a common-mode input voltage of 0 Volt.

According to a further embodiment, if, alongside the DC-signal component of the measurement signal, the offset voltage of the measurement amplifier is also to be compensated, then a voltage corresponding to the offset voltage to be compensated is disposed at the output of the second amplifier, with a similar dimensioning of the resistors of the second amplifier realized as an adding amplifier. Accordingly, this compensation value is significantly reduced by comparison with the compensation value of the prior art.

According to a further embodiment, the voltage disposed at the inverting input of the measurement amplifier, in the case of a unit for subtraction realized at the input end of the measurement amplifier, is distanced only slightly away from the optimal operating point of the measurement amplifier. In this operational case also, the measurement amplifier may thus also be operated at least approximately optimally.

According to a further embodiment, in the case of a unit for subtraction realized at the output end of the measurement amplifier, an operation of the measurement amplifier at the optimal operating point may also be realized for the case of an offset voltage to be compensated, because of the connection of the inverting input of the measurement amplifier to ground.

By way of example, the bandwidth of the second amplifier corresponds to the threshold frequency of the high-pass consisting of the first capacitor and the input impedance of the measurement amplifier. In this case, there is no overlapping or masked frequency range between the DC-signal component and the AC-signal component of the measurement signal.

According to a further embodiment, the signal that corresponds to the negative offset voltage in the measurement amplifier and to the negative DC-signal component of the measurement signal, and which is supplied to the inverting input of the second amplifier, is generated in a voltage source which is connected with its first terminal via a first resistor to the inverting input of the second amplifier and with its second terminal to ground. By way of example, for the realization of a negative signal, a voltage source is used, of which the relatively higher potential is disposed at the second terminal connected to ground.

Further, for the adjustment of the offset voltage to be compensated in the measurement amplifier and/or of the voltage proportional to the DC-signal component to be compensated, the signal level of the voltage source may be adjustable.

According to a further embodiment, as an alternative to the voltage source, a current source adjustable with regard to its current intensity can be used, which may be connected with its first terminal to the inverting input of the second amplifier and with its second terminal to ground. By way of example, for the realization of a negative signal, the current source generates a current which flows in the direction towards ground.

According to a further embodiment, the DC-signal component of the measurement signal is connected via a second resistor to the inverting input of the second amplifier.

According to a further embodiment, the first and second resistor and the resistor provided in the feedback branch of the second amplifier realized as an adding amplifier may be dimensioned in such a manner that, in the case of an ideal compensation of the DC-signal component of the measurement signal, through the adjusted voltage level of the voltage source or respectively through the adjusted current level of the current source—with the assumption that the offset voltage of the measurement amplifier is not additionally compensated—the two currents to be added in the second amplifier cancel each other out at the summation point upstream of the inverting input of the second amplifier.

According to a further embodiment, if the offset voltage in the measurement amplifier also is to be compensated by adjusting a voltage level or current level corresponding to the offset voltage to be compensated in the voltage source or in the current source, a current different from zero, which flows from the output of the second amplifier via the feedback resistor to the summation point, is obtained at the summation point upstream of the inverting input of the second amplifier. The current flowing from the output of the second amplifier thus causes an output voltage which corresponds to the offset voltage to be compensated in the measurement amplifier.

By way of example, because no high-frequency signal components are supplied to the second amplifier, high demands with regard to the bandwidth need not be placed on the selection of the second amplifier. Instead, high-quality DC-signal properties can be advantageously achieved for the second amplifier, such as, a high linearity and a high accuracy (low internal offset voltage and currents, low drift).

According to a further embodiment, for the realization of a defined input impedance of the measurement amplifier (e.g., a system impedance of 50 ohms), the non-inverting input of the measurement amplifier is preferably connected to a first terminal of a third resistor which provides the desired input impedance, while the second terminal of this third resistor is connected to ground. In this manner, the threshold frequency of the high-pass comprising the capacitance of the first capacitor and the input impedance of the measurement amplifier is advantageously established in an unambiguous manner.

According to a further embodiment, the output of the measurement amplifier is connected via a first digital-analog converter to the non-inverting input of the unit for subtraction realized at the output end of the measurement amplifier, which is realized as a first subtraction element, and the output of the second amplifier is connected via a second analog-digital converter to the respective inverting input of the first subtraction element. In this manner, the subtraction and accordingly the compensation of the offset voltage take place in a digital manner.

Further, the digitized output signal of the measurement amplifier comprises an additional offset error because of the quantization error caused in the first analog-digital converter. In order to minimize this additional quantization error advantageously with regard to the compensation result, for example, the quantization error generated in the second analog-digital converter is kept as low as possible in order to determine a compensation value with the maximum possible accuracy. For this purpose, the accuracy of the second analog-digital converter may be increased by comparison with the accuracy of the first analog-digital converter.

Further, along with an undesired time-constant offset voltage, the measurement amplifier may also be subjected to an undesired time-variable drift. For the compensation of such a drift, according to a further embodiment, a unit for the removal of an average value from the output signal of the first analog-digital converter is connected downstream of the first analog-digital converter. By way of example, the unit for the removal of an average value comprises a digital averaging filter and a digital subtraction element connected downstream. By way of further example, in order to compensate the drift occurring in the measurement amplifier effectively, the digital averaging filter performs an averaging of an appropriate number of sampled values of the output signal of the first analog-digital converter.

Accordingly, the compensation circuit according to example embodiments of the present invention can be used for every measurement signal of a measuring device, such as an oscilloscope. In this context, every input terminal of this measuring device is guided to a measurement signal terminal of a compensation circuit according to such example embodiments.

Further, the compensation circuit according to example embodiments of the present invention can be used for every measurement signal which is measured by a measurement probe of a measurement sensor. For this purpose, the measurement signal detected by the measurement probe of the measurement sensor is supplied to the measurement-signal terminal of the compensation circuit according to such example embodiments.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings, in which like reference numerals refer to similar elements, and in which.

DETAILED DESCRIPTION

A compensation circuit and a measurement device and a measuring sensor for the compensation of the offset voltage present in the measurement amplifier, and of the DC-signal component present in a measurement signal, which can also compensate relatively high offset voltages in the measurement amplifier and relatively high DC-signal components in the measurement signal accurately, is described.

Figure 1:
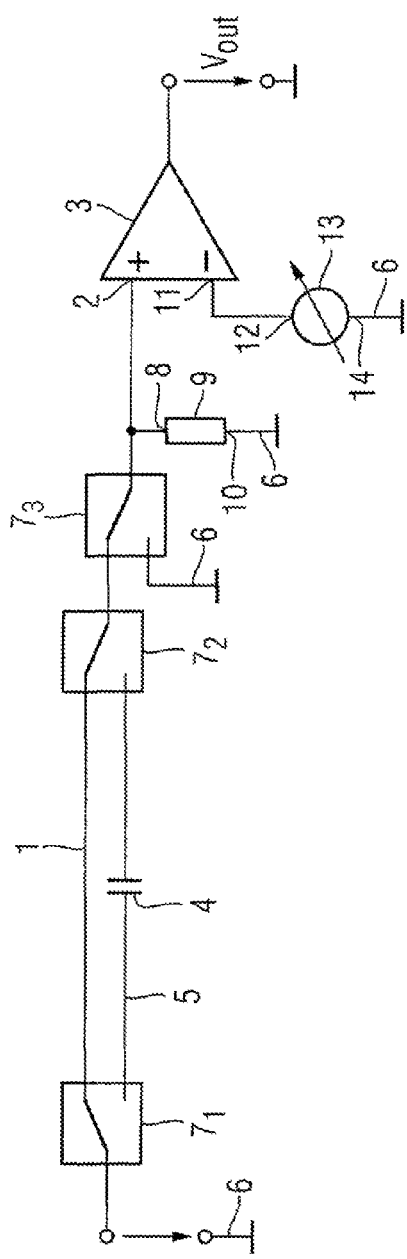
FIG. 1 illustrates a block-circuit diagram of various signal couplings of a measurement amplifier.
Figure 2A:
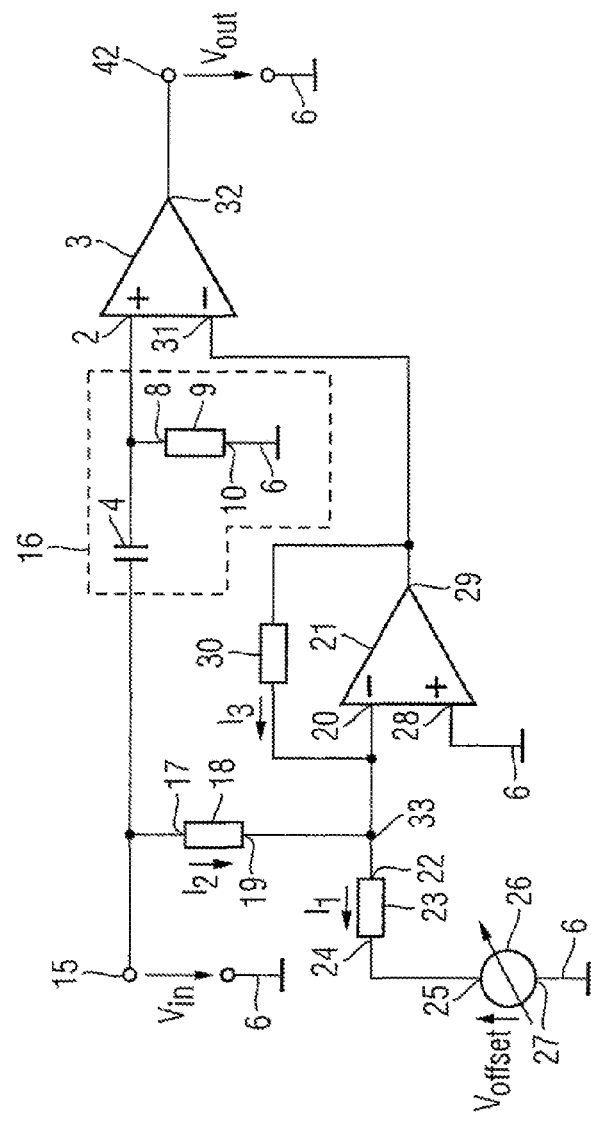
FIG. 2A illustrates a block-circuit diagram of a first compensation circuit with a first variant for the generation of a compensation signal, in accordance with example embodiments.

FIG. 2A illustrates a block-circuit diagram of a first compensation circuit with a first variant for the generation of a compensation signal, in accordance with example embodiments of the present invention.

A measurement signal $V_{in}$ is applied at a measurement-signal terminal 15. The measurement signal $V_{in}$ is applied with respect to a connection to the ground 6. The measurement-signal terminal 15 is connected via a first capacitor 4 to the non-inverting input 2 of a measurement amplifier 3. The non-inverting input 2 of the measurement amplifier 3 is additionally connected to the first terminal 8 of a third resistor 9, which is connected to ground 6 with its second terminal 10. The third resistor 9 comprises a defined impedance value, typically a system impedance (e.g., 50 ohms). This impedance value represents the desired input impedance of the circuit. The first capacitor 4 and the third resistor 9 represent a high-pass circuit 16, which is permeable for relatively high-frequency signal components of the measurement signal $V_{in}$ above a threshold frequency. The threshold frequency of the high-pass circuit 16 results from the capacitance of the first capacitor 4 and the resistance value of the third resistor 9.

The measurement-signal terminal 15 is additionally connected to the first terminal 17 of a second resistor 18, of which the second terminal 19 is guided to the inverting input 20 of a second amplifier 21. The inverting input 20 of the second amplifier 21 is additionally connected to the second terminal 22 of a first resistor 23, of which the first terminal 24 is connected to the first terminal 25 of a voltage source 26. As with the measurement signal $V_{in}$, the voltage source 26 is applied with respect to a connection to the ground 6. By way of example, the voltage source 26 is adjustable with regard to its voltage level, and generates a voltage $V_{offset}$, of which the reference potential is disposed at the second terminal 27.

With the adjusted voltage $V_{offset}$, the DC-signal component in the measurement signal $V_{in}$, and/or an offset voltage present in the measurement amplifier 3 is compensated.

By way of example, the adjustment of the voltage $V_{offset}$ can be implemented either manually by a user of the compensation circuit or automatically by an automatic voltage-level control (not illustrated in FIG. 2A). The adjusted voltage-level value is consequently proportional to the DC-signal component to be compensated in the measurement signal $V_{in}$ and/or to the offset voltage to be compensated in the measurement amplifier 3.

The non-inverting input 28 of the second amplifier 21 is guided to ground 6. A fourth resistor 30 is connected between the inverting input 20 and the output 29 of the second amplifier 21, which, for example, is configured as an adding amplifier. The output 29 of the second amplifier 21 is connected, in turn, to the non-inverting input 31 of the measurement amplifier 3.

According to one embodiment, the second amplifier 21 comprises a given bandwidth, and accordingly a low-pass behavior, only low-frequency signal components of the measurement signal $V_{in}$ are guided via the signal path comprising the second resistor 18 and the second amplifier 21. According to a further embodiment, if the bandwidth of the second amplifier 21 corresponds to the threshold frequency of the high-pass circuit 16, then the signal components of the measurement signal $V_{in}$ disposed above the threshold frequency are guided in the signal path via the first capacitor 4, and the signal components of the measurement signal $V_{in}$ disposed below the threshold frequency are guided via the second resistor 18 and the second amplifier 21.

The summation point 33 upstream of the inverting input 20 of the second amplifier 21 represents a virtual ground point and accordingly has the potential of the ground 6.

The current $I_1$ through the first resistor 23 to the first terminal 25 of the voltage source 26, which results from the ratio of the voltage level $V_{offset}$ adjusted in the voltage source 26 and the resistance value of the first resistor 23, corresponds to the sum of the current $I_2$ through the second resistor 18, which results from the ratio of the measurement signal $V_{in}$ and the resistance value of the second resistor 18, and the current $I_3$ through the fourth resistor 30 from the output 29 up to the inverting input 20 of the second amplifier 21, which results from the ratio of the output voltage of the second amplifier 21 and the resistance value of the fourth resistor 30.

The current $I_1$ of the voltage source 26, therefore, serves for the compensation of the current $I_2$ through the second resistor 18, which is proportional to the DC-signal component to be compensated of the measurement signal $V_{in}$, and the compensation of the current $I_3$ through the third resistor 30 which is above the resistance value of the third resistor 30 to the output voltage of the second amplifier 21, and is thus proportional to the offset voltage to be compensated of the measurement amplifier 3.

By way of example, through appropriate dimensioning of the first resistor 23, the second resistor 18 and the fourth resistor 30, appropriate amplification factors can be achieved between the output voltage of the second amplifier 21 and the voltage $V_{offset}$ of the voltage source 26 or respectively the voltage level $V_{in}$ of the measurement signal. By way of further example, the ratio of the voltage level $V_{in}$ of the measurement signal relative to the output voltage of the second amplifier 21 may be 1:1, while the ratio of the voltage level $V_{offset}$ generated by the voltage source 26 may be within a range between 1:10 and 1:100. In this manner, a voltage source 26 can be used, which generates a voltage level $V_{offset}$ which is lower by the factor 10 to 100 than the voltage level $V_{in}$ of the measurement signal. By way of further example, resistance values for the first resistor 23 may be between 100 kΩ and 1 MΩ, for the second resistor 18 at around 10 MΩ and for the fourth resistor also at around 10 MΩ.

According to a further embodiment of the compensation circuit, the output signal 29 of the second amplifier 21 is guided to the inverting input 31 of the measurement amplifier 3. In this manner, the difference formation between the offset voltage caused in the measurement amplifier 3 and the associated compensation value within the measurement amplifier 3 is implemented. The unit for subtraction, which is realized at the input end of the measurement amplifier 3 is thus integrated in the measurement amplifier 3.

The output signal $V_{out}$ at the output 32 of the measurement amplifier 3, and thus at the output terminal 42, which is referenced to the potential of the ground 6, is consequently compensated with regard to the DC-signal component of the measurement signal $V_{in}$ at the measurement signal terminal 15 and with regard to an offset voltage occurring in the measurement amplifier 3.

Figure 2B:
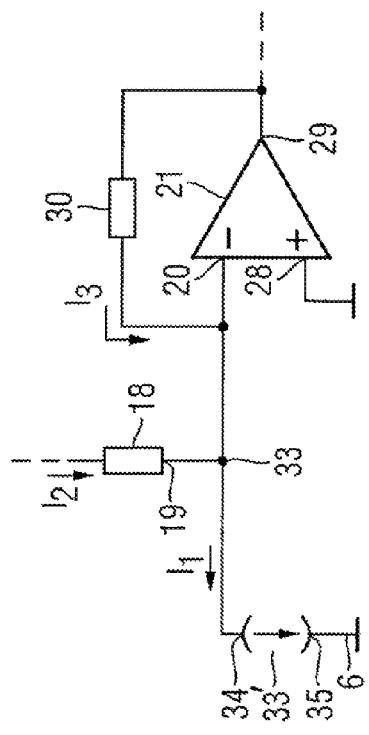
FIG. 2B illustrates a block-circuit diagram of a second variant for the generation of a compensation signal, in accordance with example embodiments.

FIG. 2B illustrates a block-circuit diagram of a second variant of a generation of a compensation signal, in accordance with example embodiments of the present invention. In FIG. 2B, only the elements of the compensation circuit that are associated with the second variant for the generation of a compensation signal are illustrated. The elements of the compensation circuit that are not illustrated in FIG. 2B correspond to those elements illustrated in FIG. 2A, and are thus not repeated for the description of the embodiment of FIG. 2B.

Instead of a voltage source 26, the second variant comprises a current source 33', of which the first terminal 34 is connected to the summation node 33, and of which the second terminal 35 is connected to the potential of the ground 6. The first resistor 23 according to the embodiment of FIG. 2A is not required with the embodiment of FIG. 2B. The current source 33' is configured in such a manner that it generates a current which flows from the summation node 33 to the first terminal 34 of the current source 33'. By way of example, the current level of the current source 33' is also adjustable.

The current $I_1$ of the current source 33' compensates the current $I_2$ through the second resistor 18 which is proportional to the DC-signal component to be compensated of the measurement signal $V_{in}$, and the current $I_3$ through the fourth resistor 30, which is proportional (taking into consideration the resistance value of the fourth resistor 30) to the output voltage of the second amplifier 21, and accordingly to the offset voltage to be compensated in the measurement amplifier 3.

Figure 3:
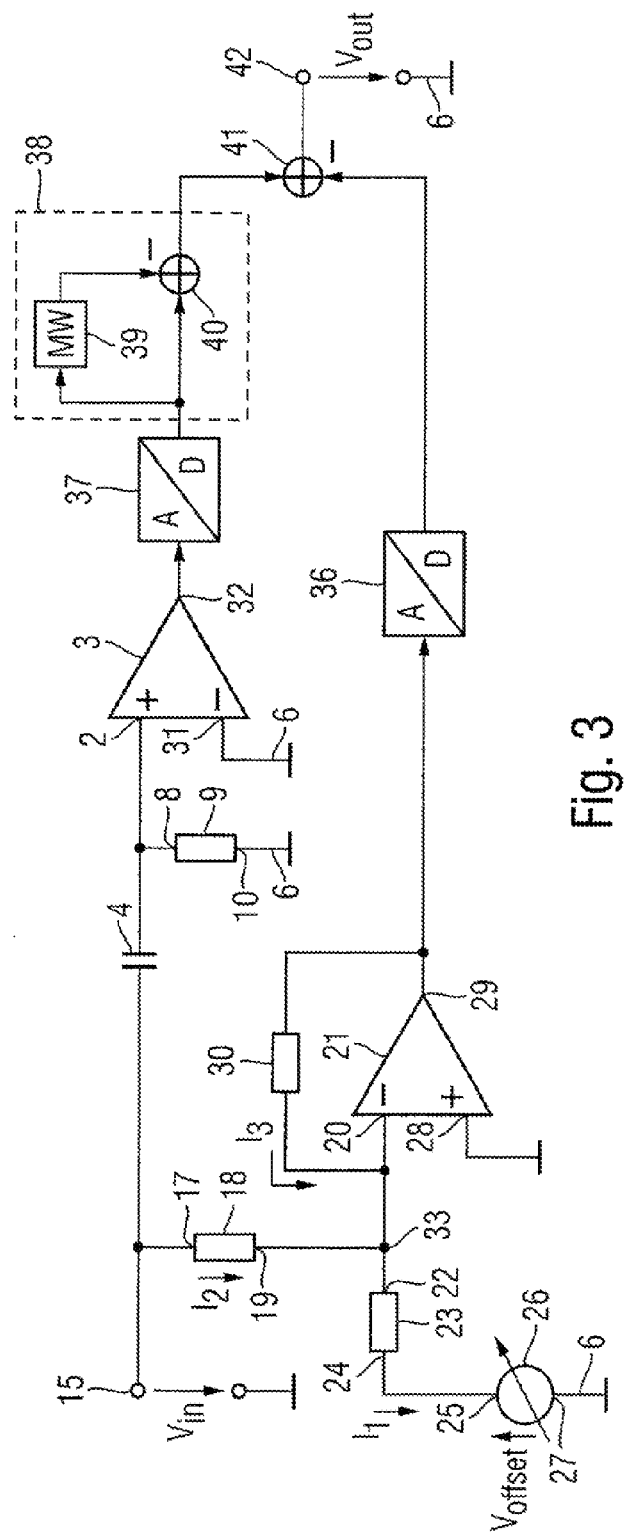
FIG. 3 illustrates a block-circuit diagram of a second compensation circuit, in accordance with example embodiments.

FIG. 3 illustrates a block-circuit diagram of a second compensation circuit, in accordance with example embodiments of the present invention. The description of elements already described with reference to FIGS. 2A and 2B are not repeated in the following description of the embodiment of FIG. 3.

With reference to FIG. 3, the output 29 of the second amplifier 21 is connected to the input of a second analog-digital converter 36. The inverting input 31 of the measurement amplifier 3 is connected instead to the ground 6. The output 32 of the measurement amplifier 3 is connected to the input of the first analog-digital converter 37.

The resolution of the second analog-digital converter 36 is increased by comparison with the resolution of the first analog-digital converter 37. For example, a resolution of 8 bits is used for the first analog-digital converter 37, while the second analog-digital converter 36 comprises a resolution of 16 bits. In this manner, the increase (caused by the quantization error of the first analog-digital converter 37) of the offset in the signal path of the measurement amplifier 3 (the signal path of the AC-signal component of the measurement signal $V_{in}$) can be corrected more exactly through a compensation value with a higher resolution, namely the compensation value in the signal path of the second amplifier 21 (the signal path of the DC-signal component of the measurement signal $V_{in}$). The output of the first analog-digital converter 37 is connected to the input of a component 38 for the removal of an average value. By way of example, the component 38 comprises a digital filter 39 (e.g., embodied as a digital averaging filter), and a second subtraction element 40 connected downstream. The non-inverting input of the second subtraction element 40 is connected to the output of the first analog-digital converter 37, and the inverting input of the second subtraction element 40 is connected to the output of the digital averaging filter 39.

The digital averaging filter 39 determines the average value of the digitized output signal of the measurement amplifier 3 at the output of the first analog-digital converter 37. In this context, the averaging is implemented over several sampled values of the digitized output signal of the measurement amplifier 3. In this manner, a varied average value of the digitized output signal of the measurement amplifier 3 caused by a drift of the measurement amplifier 3 can be determined and then compensated continuously through the subtraction in the second subtraction element 40. The number of sampled values which go into the average should be selected appropriately dependent upon the rate of drift.

A first digitally realized subtraction element 41, of which the non-inverting input is connected to the output of the component 38 and of which the inverting input is connected to the output of the second analog-digital converter 36, represents a unit for subtraction, which is realized at the output end of the measurement amplifier 3, and implements a compensation of the offset voltage contained in the measurement amplifier 3 and optionally of a quantization error caused by the first analog-digital converter 37.

The digitized output signal $V_{out}$ at the output terminal 42, which is referenced to the potential of the ground 6, is consequently compensated with regard to the DC-signal component of the original measurement signal $V_{in}$ and with regard to the undesired offset voltage caused by the measurement amplifier 3.

The compensation circuit according to example embodiments of the present invention can be used for every measurement signal of a measuring device, such as an oscilloscope. In this context, every input terminal of this measuring device is guided to a measurement signal terminal of a compensation circuit according to such example embodiments.

Further, the compensation circuit according to example embodiments of the present invention can be used for every measurement signal which is measured by a measurement probe of a measurement sensor. For this purpose, the measurement probe of the measurement sensor is connected to the measurement-signal terminal 15 of a compensation circuit according to such example embodiments.

The invention is not restricted to the embodiments and variants presented. In particular, all combinations of all of the features disclosed in the description, all of the features claimed in each of the claims and all of the features illustrated in each of the Figs. of the drawings are also covered by the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A device for compensation of one or more of an offset voltage of a measurement amplifier and a DC-signal component of a measurement signal input to the measurement amplifier, the device comprising:

a signal terminal configured to receive the measurement signal;

a second amplifier configured to add the DC-signal component of the measurement signal with a signal corresponding to a negative offset voltage and to a negative of the DC-signal component; and a subtractor device, arranged at one of an input terminal or an output terminal of the measurement amplifier, configured to subtract an output signal of the second amplifier from an AC-signal component of the measurement signal; and wherein the measurement amplifier is configured to receive the AC-signal component of the input measurement signal at a non-inverting input terminal.

2. The device according to claim 1, wherein the AC-signal component of the measurement signal is supplied via a first capacitor of a respective capacitance arranged between the signal terminal and the non-inverting input terminal of the measurement amplifier, and wherein a bandwidth of the second amplifier corresponds to a threshold frequency resulting from the respective capacitance of the first capacitor and an input impedance of the measurement amplifier.

3. The device according to claim 1, wherein the signal corresponding to the negative offset voltage and to the negative of the DC-signal component is generated via a voltage source having a voltage level that is adjustable.

4. The device according to claim 3, wherein the voltage source is arranged with a first terminal connected via a first resistor to an inverting input terminal of the second amplifier, and with a second terminal connected to ground.

5. The device according to claim 4, wherein the voltage level of the voltage source is at a higher potential at the second terminal relative to the first terminal.

6. The device according to claim 1, wherein the signal corresponding to the negative offset voltage and to the negative of the DC-signal component is generated via a current source having a current level that is adjustable.

7. The device according to claim 6, wherein the current source is arranged with a first terminal connected to an inverting input terminal of the second amplifier, and with a second terminal connected to ground.

8. The device according to claim 7, wherein the current source is configured to generate a current that flows in a direction towards the second terminal connected to ground.

9. The device according to claim 1, wherein the DC-signal component of the measurement signal is connected via a second resistor to an inverting input terminal of the second amplifier.

10. The device according to claim 1, wherein the non-inverting input terminal of the measurement amplifier is connected to ground via a third resistor, which corresponds to the desired input impedance of the measurement amplifier.

11. The device according to claim 1, wherein the subtractor device is integrated in the measurement amplifier in that an output terminal of the second amplifier is connected to an inverting input terminal of the measurement amplifier.

12. The device according to claim 1, wherein the subtractor device is a first subtraction circuit, which is arranged whereby an output terminal of the measurement amplifier is connected via a first analog-to-digital (A/D) converter to a non-inverting input terminal of the first subtraction circuit, and an output terminal of the second amplifier is connected via a second analog-to-digital (A/D) converter to an inverting input terminal of the first subtraction circuit.

13. The device according to claim 12, wherein an accuracy of the second A/D converter is higher relative to an accuracy of the first A/D converter.

14. The device according to claim 12, wherein a circuit configured to remove an average value from an output signal of the first A/D converter is connected between the first A/D converter and the first subtraction circuit.

15. The device according to claim 14, wherein the circuit configured to remove an average value from the output signal of the first A/D converter comprises a digital averaging filter and a second subtraction circuit.

16. The device according to claim 12, wherein an inverting input terminal of the measurement amplifier is connected to ground.

17. A measuring device comprising at least one input terminal, wherein each input terminal is connected to a signal terminal of a measurement circuit configured to compensate for one or more of an offset voltage of a measurement amplifier and a DC-signal component of a measurement signal input to the measurement amplifier, wherein the measurement circuit comprises:
   a second amplifier configured to add the DC-signal component of the measurement signal with a signal corresponding to a negative offset voltage and to a negative of the DC-signal component; and
   a device, arranged at one of an input terminal or an output terminal of the measurement amplifier, configured to subtract an output signal of the second amplifier from an AC-signal component of the measurement signal; and
   wherein the measurement amplifier is configured to receive the AC-signal component of the input measurement signal at a non-inverting input terminal.

18. A measurement sensor comprising a measurement probe, wherein the measurement probe is connected to a signal terminal of a measurement circuit configured to compensate for one or more of an offset voltage of a measurement amplifier and a DC-signal component of a measurement signal input to the measurement amplifier, wherein the measurement circuit comprises:
   a second amplifier configured to add the DC-signal component of the measurement signal with a signal corresponding to a negative offset voltage and to a negative of the DC-signal component; and
   a device, arranged at one of an input terminal or an output terminal of the measurement amplifier, configured to subtract an output signal of the second amplifier from an AC-signal component of the measurement signal; and
   wherein the measurement amplifier is configured to receive the AC-signal component of the input measurement signal at a non-inverting input terminal.

* * * * *